United States Patent
Lefebvre (10) Patent No.: US 8,081,036 B2
(45) Date of Patent: Dec. 20, 2011

(54) ELECTRONIC DEVICE USED FOR MEASURING AND DETECTING THE VARIATIONS OF AT LEAST ONE INPUT SIGNAL

(75) Inventor: Jean-Noel Lefebvre, Lyons (FR)

(73) Assignee: Noalia Gestion (FR)

( * ) Notice: Subject to any disclaimer, the term of this patent is extended or adjusted under 35 U.S.C. 154(b) by 232 days.

(21) Appl. No.: 12/514,324

(22) PCT Filed: Nov. 12, 2007

(86) PCT No.: PCT/FR2007/001860
§ 371 (c)(1),
(2), (4) Date: Jun. 23, 2009

(87) PCT Pub. No.: WO2008/068412
PCT Pub. Date: Jun. 12, 2008

(65) Prior Publication Data
US 2010/0059355 A1    Mar. 11, 2010

(30) Foreign Application Priority Data
Nov. 10, 2006  (FR) .................................. 06 09849

(51) Int. Cl.
*H03L 7/24*      (2006.01)
*G01N 27/22*     (2006.01)
*G06F 3/044*     (2006.01)

(52) U.S. Cl. ............ 331/55; 331/65; 340/542; 345/174

(58) Field of Classification Search ............... 331/46, 331/47, 55, 14, 172, 65; 327/156; 324/633, 324/655, 656; 340/562; 345/173, 174
See application file for complete search history.

(56) References Cited

U.S. PATENT DOCUMENTS

| | | |
|---|---|---|
| 4,169,260 A | 9/1979 | Bayer |
| 4,222,045 A | 9/1980 | Cholin |
| 5,034,722 A | 7/1991 | Premack |
| 7,218,224 B2 * | 5/2007 | Tokudome ................. 340/561 |
| 2005/0184876 A1 | 8/2005 | Tokudome |
| 2007/0229468 A1 * | 10/2007 | Peng et al. ................. 345/173 |

FOREIGN PATENT DOCUMENTS
GB   978212    12/1964

OTHER PUBLICATIONS
International Search Report PCT/FR2007/001860 Dated May 8, 2008.
* cited by examiner

*Primary Examiner* — Ryan Johnson
(74) *Attorney, Agent, or Firm* — Cantor Colburn LLP (57) ABSTRACT

The device has a component providing an outlet signal whose oscillation frequency depends on a physical unit to be measured, and a reference oscillator. A phase comparison component compares the component and the oscillator for control on the component or for mutual control. A synchronization unit permits alternatively blocking and oscillation of the component. A determination unit determines a derivative signal from evolution of the output signal of the component. The device also includes an electrostatic type keyboard having an electrode assembly.

21 Claims, 12 Drawing Sheets

ELECTRONIC DEVICE USED FOR MEASURING AND DETECTING THE VARIATIONS OF AT LEAST ONE INPUT SIGNAL

FIELD OF THE INVENTION

The invention relates to an electronic device, intended for measuring and detecting variations of at least one input signal to be measured, as well as to a system comprising at least two aforesaid electronic devices, and a keyboard array using said device or system.

BACKGROUND OF THE INVENTION

It is known to embody a detection and measurement device comprising:
- a first component providing an output signal whose oscillation frequency is representative of an input signal,
- a reference oscillator,
- a phase comparison component carrying out a comparison between the oscillations of the first component and of the reference oscillator, in particular for the purpose of a slaving by a loop of the reference oscillator to the first component, or of the first component to the reference oscillator, or of a mutual slaving, and
- means of elastic coupling between the first component and the reference oscillator.

Document U.S. Pat. No. 5,034,722 and document GB978212 describe such a device in particular.

The signal obtained as output from the phase comparison component makes it possible to have an indication of the variation of the signal from the first component, itself representative of the input signal.

The elastic coupling tends to maintain a fixed phase shift and oscillation frequencies differing slightly from the nominal frequency for the first component and the reference oscillator, once these two components are brought to nominal frequencies that are close together.

This coupling makes it possible to reduce the disturbances of the output of the phase comparison component which are due to noise intrinsic to the device, for example thermal noise or to noise extrinsic to the device, for example electromagnetic disturbances.

The action of the coupling is furthermore carried out while preserving the weak variations of the signal from the first oscillator, these weak variations being indicative of the event that one seeks to detect or to measure.

Thus the coupling makes it possible to render the output signal from the phase comparison component utilizable for the measurement of the input signal.

It is nevertheless desirable to refine the type of device presented above so as to increase the latter's measurement sensitivity, and to decrease its sensitivity to transient electromagnetic disturbances.

It is also desirable to allow operation with several sensors which may mutually influence one another and so as to allow resources to be shared between several sensors or electrodes in the case of multiplexings.

BRIEF SUMMARY OF THE INVENTION

The aim of the present invention is therefore to provide a device affording all or some of the following advantages: increased measurement sensitivity, and decreased sensitivity to exterior disturbances, operation facilitated with several sensors and resource sharing between several sensors.

For this purpose, the subject of the present invention is a device of the aforesaid type, characterized in that it comprises synchronization means designed to block or permit alternatively the influence of the oscillations of the first component on the phase comparison component and on the elastic coupling means, and means for determining a derived signal from the evolution of the output signal from the phase comparison component.

Operation takes place under transient conditions, at each unblocking of the influence of the first component on the phase comparison component.

Each time the oscillations of the first component reach the input of the phase comparison component, the output signal from the phase comparison component progressively regains its nominal value, that is to say the value when conditions are steady if the signal of the first component has not been blocked.

The slope of the output signal from the phase comparison component during each period where the oscillations of the first component reach the input of the phase comparison component, that is to say the speed at which the first component and the reference oscillator come back into phase is directly influenced by three factors:
- The value of the nominal frequencies of the first component and of the reference oscillator at the operating point
- The "force" of the elastic coupling
- The difference of the two nominal frequencies of the first component and of the reference oscillator: the closer the nominal frequencies, the faster they come back into phase.

Consequently, in this device, the variation of the physical magnitude to be measured is given by the slope of the output signal from the phase comparison component during the phase where the oscillations of the first component reach the input of the phase comparison component.

The use of the derived signal affords an appreciable increase in the sensitivity of the device with respect to the prior art systems.

These devices can be used in very diverse applications, in particular within the framework of the detection of persons, of the realization of surfaces that are tactile through an insulant, or of the realization of pressure sensitive surfaces.

Advantageously, the elastic coupling means are designed to carry out an asymmetric coupling in such a way that the influence of the first component on the reference oscillator is greater than the influence of the reference oscillator on the first component.

Advantageously, the elastic coupling means are designed to carry out a unidirectional coupling in such a way that the first component influences the reference oscillator.

The unidirectional mode of the coupling allows the first component to be sited some distance away without needing to remotely site the coupling link which remains local to the signal conditioning circuit downstream of this first component. Specifically, no signal originating from the reference oscillator is returned to the first component.

Thus the first component can be linked in a wired manner a few mm or a few meters of wiring distance from the other components of the device.

The first component can also be sited a long distance away by using in this case a remote link between this first component and the other component of the device. This remote link can be of any type, for example optical, radiofrequency, ultrasound, or via a computer network.

The unidirectional mode of the coupling also makes it possible to insert a frequency divider or multiplier downstream of the first component and upstream of the means of elastic coupling, thereby making it possible to change the working frequency. For example, if the working frequency of the first component is of the order of 1 Mhz, by using a divider by 10, it is possible to bring this frequency down to 100 Khz, thereby facilitating the processing of the signals.

According to an embodiment, the means for determining a derived signal from the evolution of the output signal from the phase comparison component comprise a component for measuring the slope of the output signal from the phase comparison component.

According to another embodiment, the synchronization means carry out blockings at fixed frequency, and the means for determining a derived signal from the evolution of the output signal from the phase comparison component comprise a component for measuring the peak of the signal at the end of an unblocking period.

These arrangements allow simple approximate calculation of the slope of the curve.

According to a first possibility, the first component is an oscillator linked to a sensor for measuring a physical magnitude to be measured.

According to a second possibility, the first component is a receiver of a signal external to the device.

Advantageously, the receiver is designed to receive a frequency-modulation communication signal.

Preferably, the device comprises a component for controlling the slaving of the reference oscillator or of the first component.

Advantageously, the device comprises a storage component, making it possible to maintain, according to an operating mode, a constant setpoint voltage for the control of the reference oscillator or of the first component for a determined duration.

These arrangements correspond to open-loop use.

Preferably, in an operating mode, the means for determining a derived signal are linked by a loop to the reference oscillator or to the first component so as to apply a correction setpoint with a time constant whose order of magnitude is greater than that of the variations of the input signal and less than that of the drift of this signal.

Thus, in this operating mode, a compensation making it possible to reduce the effects of slow variations and/or of the drift of the signal is carried out, without influencing the detection of the low-amplitude fast variations that one seeks to measure or detect.

Such compensation is necessary in the case where this slow variation or this drift is too big for a measurement of the fast variations to be carried out accurately.

According to a characteristic of the invention, the time constant can be adjusted to a first value in a calibration mode and to a second value, greater than the first, in a compensation mode.

In the case where the time constant is small, the signal arising from the oscillator is corrected or compensated rapidly, the reference signal for the compensation being the signal arising from the first component. Fast calibration of the device is thus obtained.

Conversely, in the measurement phase, the time constant is adjusted in such a way that it is large enough for the low-amplitude fast variations of the signal arising from the first component not to be expunged by the compensation. It should be noted that, in this case, the compensation nevertheless makes it possible to restrict the harmful effect, in particular in terms of accuracy, of the slow variations of significant amplitude.

Thus, the measurement and the detection of weak and fast variations, representative of the phenomenon to be observed, are not polluted by the unrepresentative slow variations.

Preferably, in an operating mode, the looping between the output of the means for determining a derived signal and the reference oscillator or the first component is eliminated, the operating point being maintained by the storage component.

Advantageously, in an operating mode, the looping between the output of the means for determining a derived signal and the reference oscillator or the first component is eliminated if the value of the derived signal or the slope due to the variation of this value is greater than a first determined threshold, the means for determining a derived signal being again linked by a loop to the reference oscillator or to the first component if the value of the derived signal or the slope due to the variation of this value is less than a second determined threshold.

Thus, between the start and the end of a physical event, delimited by each of the first and second thresholds, a decoupling is carried out which makes it possible to avoid any compensation over the duration of the event. The measurement obtained at the output of the means for determining a derived signal is therefore not affected by the compensation.

This operating mode is necessary when the event to be measured is of significant duration.

Advantageously, the device is intended to carry out the measurement and the detection of variations of at least two input signals, the synchronization means making it possible to selectively process one of the input signals.

These arrangements allow common pooling of most of the components and therefore a simplification of the device for the processing of several input signals.

According to an embodiment, the device comprises at least two measurement sensors and switching means controlled by the synchronization means for selectively processing the signal originating from one of the measurement sensors, a single oscillator being situated downstream of the switching means, it being possible for this oscillator to be blocked by the synchronization means.

These arrangements allow significant mutualization of the components used for the various input signals. These arrangements allow effective embodying of a device comprising several sensors of the same nature.

According to another embodiment, the device comprises at least two measurement sensors and an oscillator associated with downstream of each of the measurement sensors, the synchronization means being designed to select the output of an oscillator to be processed and to block the output of these oscillators.

These arrangements make it possible to use heterogeneous sensors, for example a capacitive sensor, an inductive sensor and an ultrasound sensor in the same device.

The subject of the present invention is also a system comprising at least two devices according to the invention, comprising common synchronization means making it possible to block alternatively the oscillations of the first component of the various devices of the system.

These arrangements make it possible to operate several devices simultaneously in one and the same environment, in an alternating operating mode.

Specifically, the first components constituting the measurement components of the various devices being placed in one and the same environment, they exert an influence on one another by way of various couplings, for example a coupling at the level of the physical method of measurement or electromagnetic coupling of the electronic circuits.

If this influence is such that it may not be neglected, the simultaneous use of the devices is not possible.

By virtue of the arrangements described above, a synchronization signal originating from the synchronization means blocks and unblocks the measurement components alternately, the activated measurement component therefore no longer being subjected to the influence of the measurement component that is blocked during the measurement.

The present invention also relates to a tactile keyboard array comprising two sets of electrodes so as to form the rows and the columns of the key array and a device or a system previously described in which the input signals originate from the electrodes.

The presence of multiple electrodes in proximity to one another causes the creation of capacitive coupling, in particular between the electrode of the rows and columns, which are in general positioned in two layers situated in proximity to one another.

Advantageously, the synchronization means block alternatively the first components linked to certain electrodes of the keyboard, while allowing operation of other first components linked to the other electrodes of the keyboard.

Preferably, the synchronization means control at one and the same time a blocking of a first component, and the grounding of the corresponding electrode.

BRIEF DESCRIPTION OF THE DRAWINGS

In any event, the invention will be properly understood with the aid of the description which follows, with reference to the appended schematic drawing representing, by way of nonlimiting example, of two forms of execution of this electronic device.

DETAILED DESCRIPTION OF THE PREFERRED EMBODIMENTS

Figure 1:
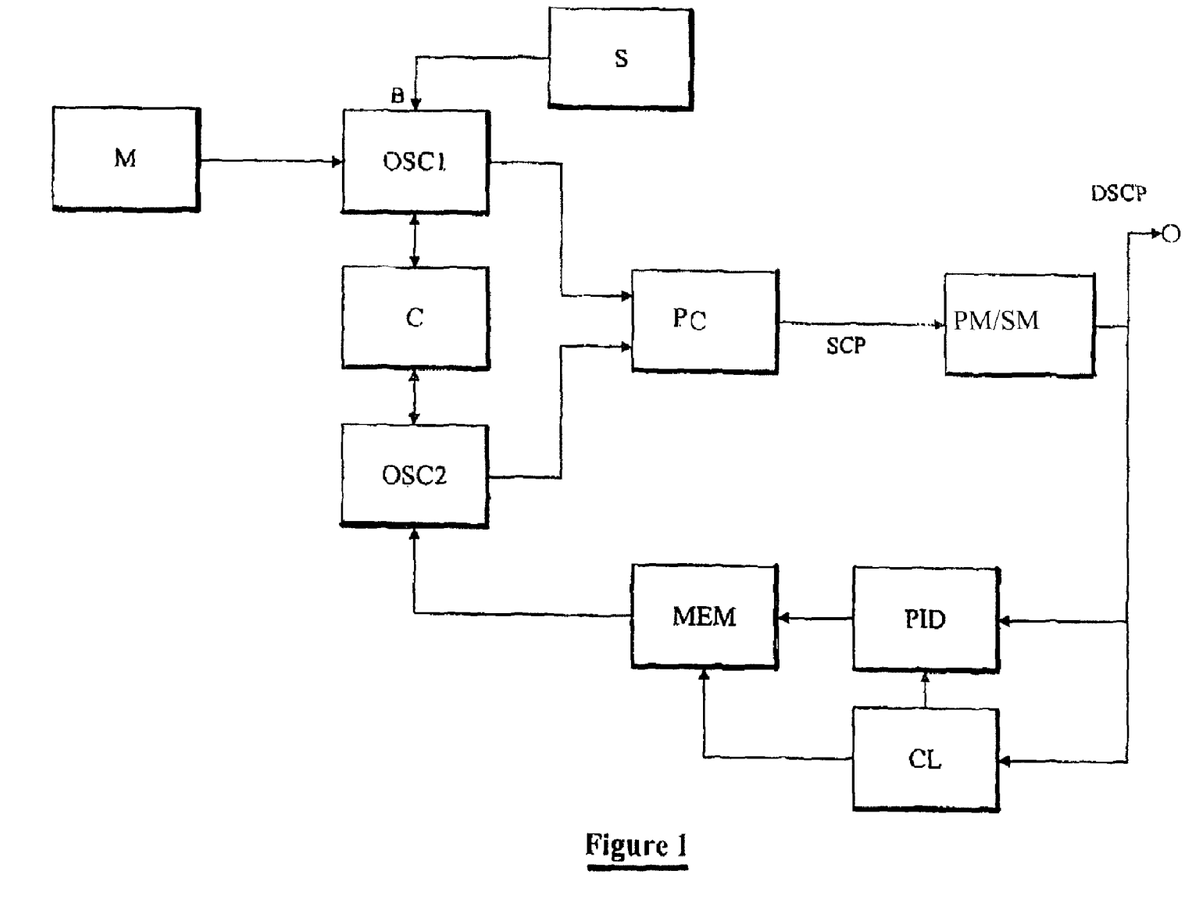
FIG. 1 is a basic diagram of a first device according to the invention.
Figure 5:
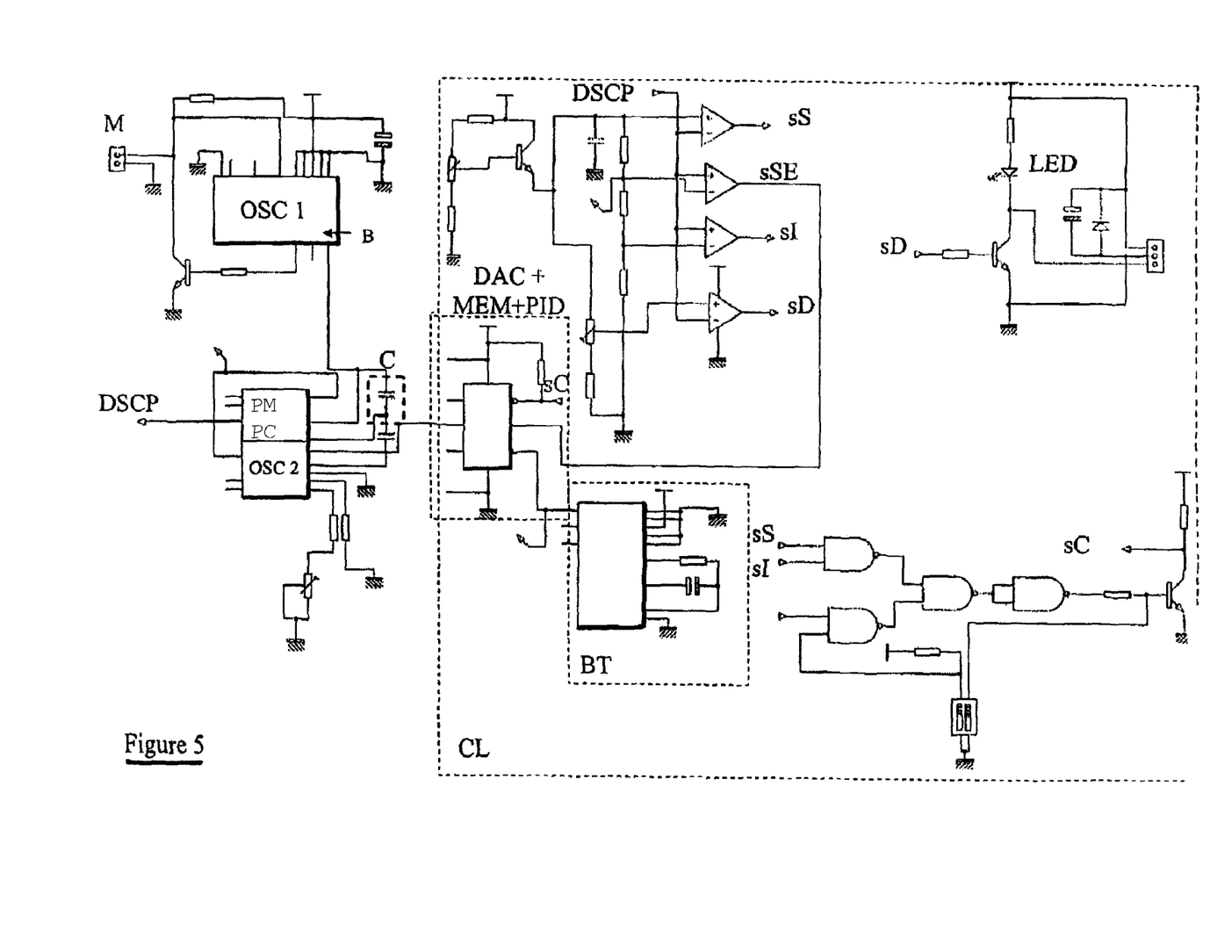
FIG. 5 is an electrical diagram for the device of FIG. 1.

According to a first embodiment, represented in FIGS. 1 and 5, a device according to the invention comprises a first oscillator OSC1 linked to a physical sensor M. The sensor M determines the nominal frequency of the first oscillator OSC1. The latter returns an oscillating signal as output.

The first oscillator OSC1 has a blocking input B driven by a synchronization component S.

The first oscillator OSC1 is coupled to a second oscillator OSC2 by a coupling component C. This involves a so-called elastic coupling.

Advantageously, the coupling between the first and the second oscillator is an asymmetric coupling, in such a way that the first oscillator OSC1 influences the second oscillator OSC2.

The asymmetry is achieved by the fact that the coupling component is linked to the first oscillator OSC1 by a low-impedance output and to the second oscillator OSC2 by a high-impedance input.

The output of the first oscillator is conveyed on a first input of a phase comparison component PC, the output of the second oscillator OSC2 being conveyed on its second input.

A signal SCP representative of the phase difference between the input signals is obtained at the output of the phase comparison component PC.

At the output of the PC is arranged a component for Peak measurement or for Slope Measurement PM/SM.

The output signal DSCP from the peak or slope measurement component PM/SM then provides an item of information reflecting the variations of the physical magnitude to be measured.

The output of the peak measurement or slope measurement component PM/SM is linked to a control component of the second oscillator OSC2, carrying out for example a control of Proportional, Integral, Derivative (PID) type, or else a simple integration control.

An intermediate storage component MEM for storing the control setpoint is positioned between the output of the control component and the second oscillator.

Control logic CL makes it possible to control the use of the PID control component and of the memory MEM as we shall see below.

The control logic CL can be embodied as hard-wired logic or advantageously based on a microcontroller which can include all or some of the components for PID control, Memory storage MEM, phase comparison PC, reference oscillator OSC2 and synchronization S.

Attention will now be turned to the manner of operation of the device described in FIG. 1.

In a first so-called calibration operating mode, the output of the Peak measurement or Slope Measurement component PM/SM is linked by a loop to the second oscillator OSC2, applying a correction setpoint with a small time constant. Thus, the nominal oscillation frequency of the second oscillator OSC2 is rapidly brought down to the level of that of the first oscillator OSC1, so that the nominal operating point under steady conditions can be obtained and stabilized.

In a second so-called compensation operating mode, the output of the Peak measurement or Slope Measurement component PM/SM is linked by a loop to the second oscillator OSC2, applying a correction setpoint with a significant time constant, greater than the time constant used in the calibration mode.

In this case, the time constant is of greater order of magnitude than that of the variations of the physical magnitude to be measured and less than that of the drift of the signal representing this physical magnitude.

Thus, in the second operating mode, the nominal oscillation frequency of the second oscillator OSC2 can be brought down progressively to the nominal frequency of the first oscillator OSC1, so as to compensate for the slow variations and/or drifts.

The fast variations of the physical magnitude to be measured are not affected by a slower and progressive compensation such as that appearing during the second operating mode. In this way, the phenomenon of compensation has no effect on the measurement carried out by the device according to the invention.

Figure 4:
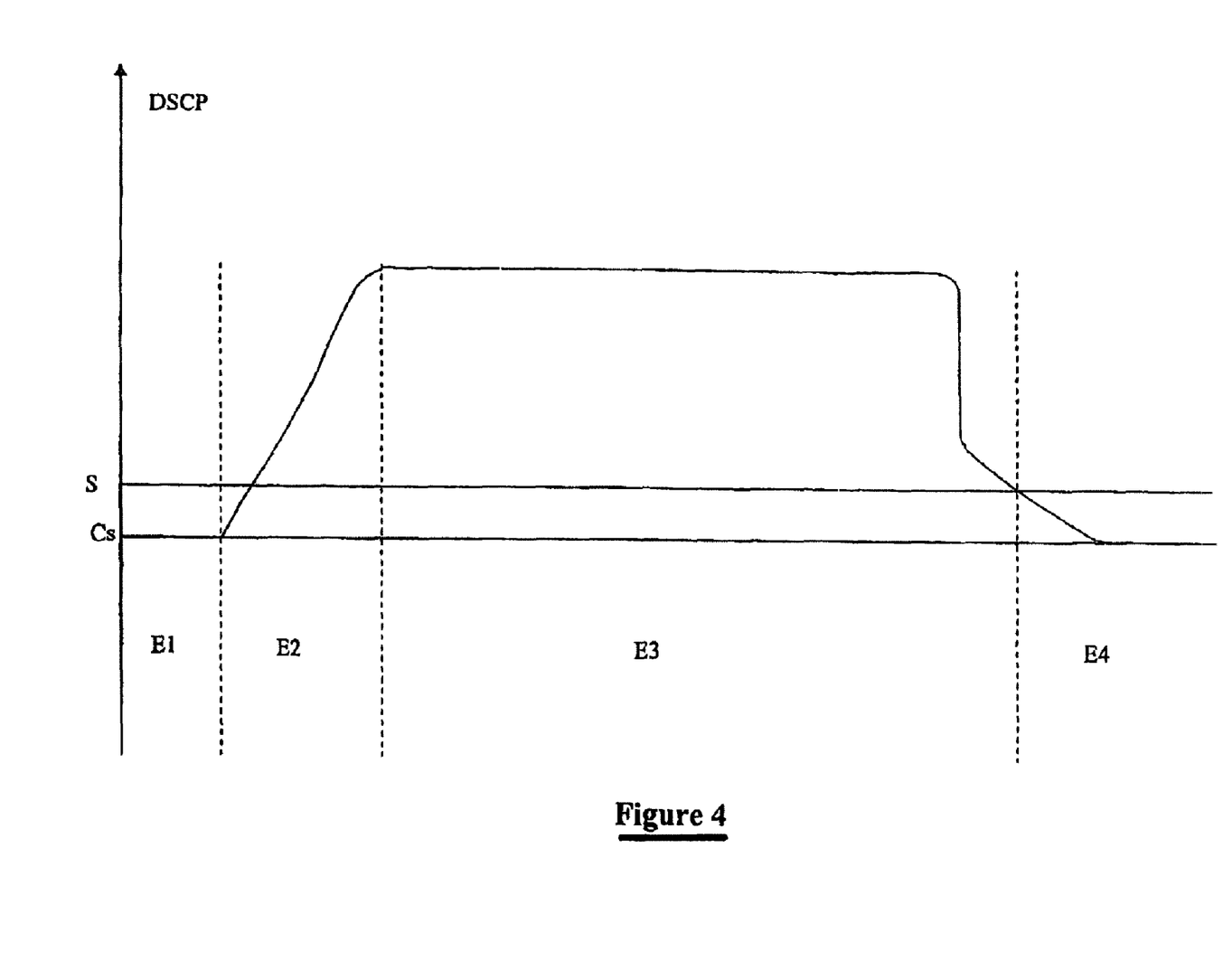
FIG. 4 is a curve representing the signal derived from the output signal from the open-loop comparison component.

The compensation can also be eliminated temporarily as we shall describe below with reference to FIG. 4.

At E1, the value of the output signal DSCP Peak measurement or Slope Measurement component PM/SM or the slope due to the variation of this value is compared with reference thresholds S. For example, as long as the value of the signal DSCP lies between the value of the setpoint Cs and the threshold S, the loop between the output of the Peak measurement or Slope Measurement component PM/SM and the second oscillator OSC2 remains closed.

The loop between the output of the Peak measurement or Slope Measurement component PM/SM and the second oscillator OSC2 is opened at E2 if the value of the output signal of the Peak measurement or Slope Measurement component PM/SM or the slope due to the variation of this value is greater than a first determined threshold, this loop being again closed at E4 if the value the value of the output signal of the Peak measurement or Slope Measurement component PM/SM or the slope due to the variation of this value is less than a second determined threshold.

When the loop is open, the operating point of the second oscillator OSC2 is maintained by way of the memory MEM. The term memory should be understood to mean any component making it possible to carry out the function of maintaining the operating point.

Such decoupling of the slaving makes it possible to avoid overcompensation phenomena.

The measurement is then carried out for the duration of the physical event delimited by the first and second thresholds.

Such an event may for example be the detection of a person walking over a pressure sensor.

A first edge during which the first threshold is overstepped appears when the foot is pressed on the sensor, a second edge during which the second threshold is overstepped appearing when the foot is removed from the sensor.

The manner of operation of the device with the synchronization means S is now described with reference to FIG. 3.

The synchronization means S block the first component, that is to say the oscillator OSC1, during determined time intervals, and allow its oscillation during other time intervals.

Each time that the oscillator OSC1 is blocked, the output signal from the comparison component SCP is saturated since only the oscillations of the controlled oscillator OSC2 reach the phase comparator PC. The oscillator OSC1 has a "zero" frequency.

Each time that the oscillator OSC1 begins oscillating again, the output signal from the comparison component SCP progressively regains its nominal value, that is to say the value under steady conditions if the oscillator OSC1 had not been blocked.

The variation of the physical magnitude to be measured is given by the slope of the output signal from the phase comparison component during the phase of unblocking of the first component.

If the synchronization means carry out blockings at fixed frequency, the means for determining the derived signal can consist of a component for measuring the peak of the signal at the end of an unblocking period. Advantageously, the peak value of the signal at the end of an unblocking period can be maintained by the component until the end of the following period, when a new peak value is determined.

Figure 3:
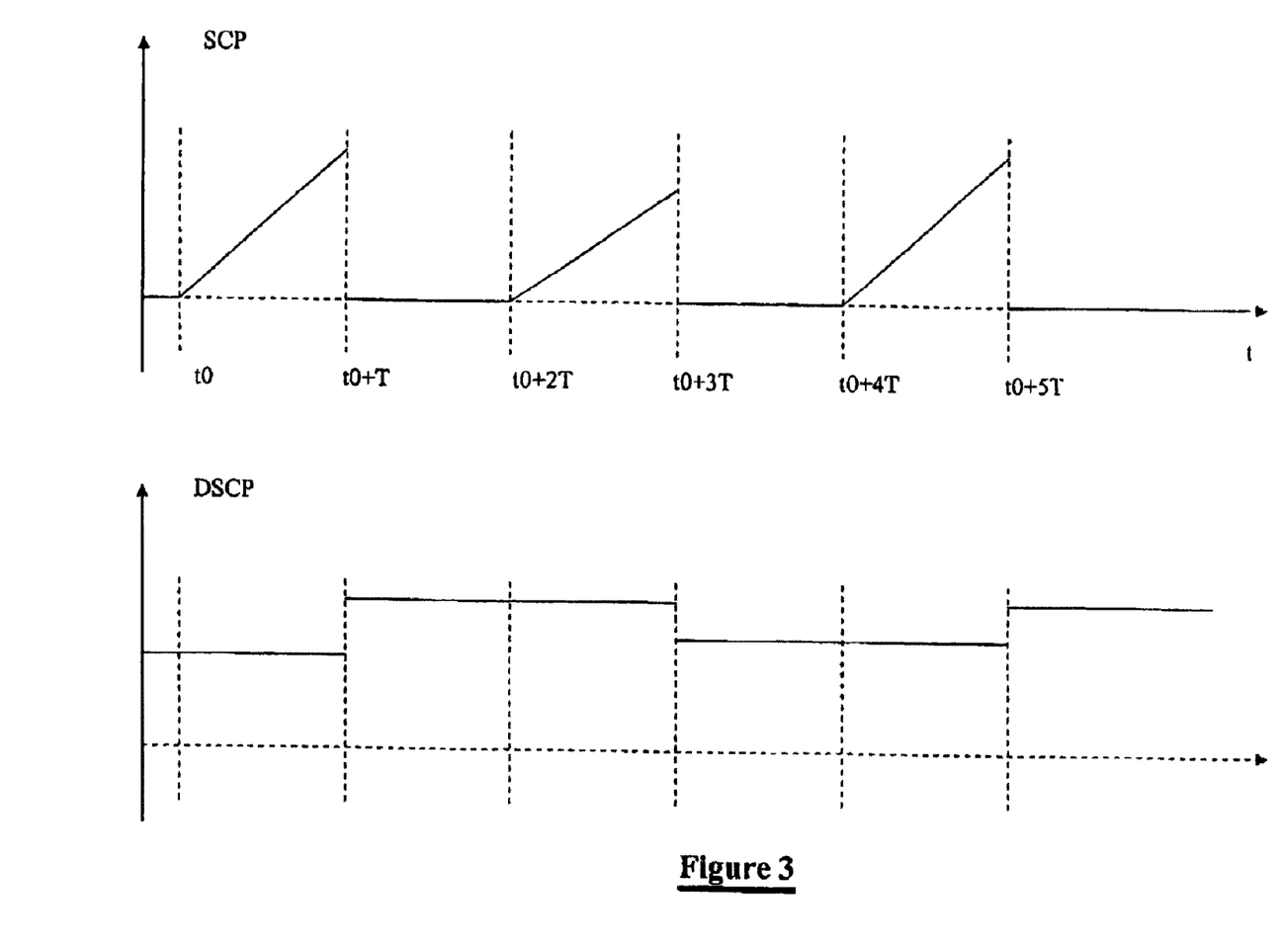
FIG. 3 represents the evolution over time of the output signal from the phase comparison and of the signal derived from this output signal.

It should be noted that the blocking periods and oscillation periods are represented with one and the same duration T in FIG. 3. Nevertheless, it is of course possible to reduce these durations are different, and in particular that the duration of a blocking is less than an oscillation period.

The electronic diagram of the device of FIG. 1 is represented in FIG. 5.

The various components of the electronic device are found again on this diagram.

The measurement sensor M is linked to the first oscillator OSC1, itself coupled to a second oscillator OSC2. The elastic coupling C is carried out here by way of a capacitor.

It is noted that the component having the function of the second oscillator 2 also has the function of the phase comparison PC and peak measurement PM component. The output of the latter, denoted DSCP, is used by the control logic CL, embodied here as hard-wired logic.

This output signal DSCP from the peak measurement component is thereafter processed by way of comparators. These comparators make it possible to obtain a signal of overstepping an upper threshold sS, a signal of overstepping a lower threshold sI, a signal corresponding to the sense of the error to be compensated sSE and a detection signal sD.

The detection signal sD can for example be used to supply an LED so as to carry out an interface with an operator.

The signals of overstepping the upper threshold sS or lower threshold sI are processed by way of logic elements so as to obtain a control signal sC. This signal sC makes it possible to control the component embodying at one and the same time the function of digital-analog converter, integrator and memory, which is in this case an electronic potentiometer, so as to obtain either a slaving of the second oscillator OSC2 by the Peak measurement component PM, or open-loop operation, without slaving of the second oscillator OSC2 and with use of the memory MEM.

Finally, a component BT making it possible to ensure the time base function is linked directly to the digital-analog converter DAC, this component making it possible to regulate the time constant of the compensation.

The converter also carries out the control, there is therefore no separate control component of PID type.

Figure 6:
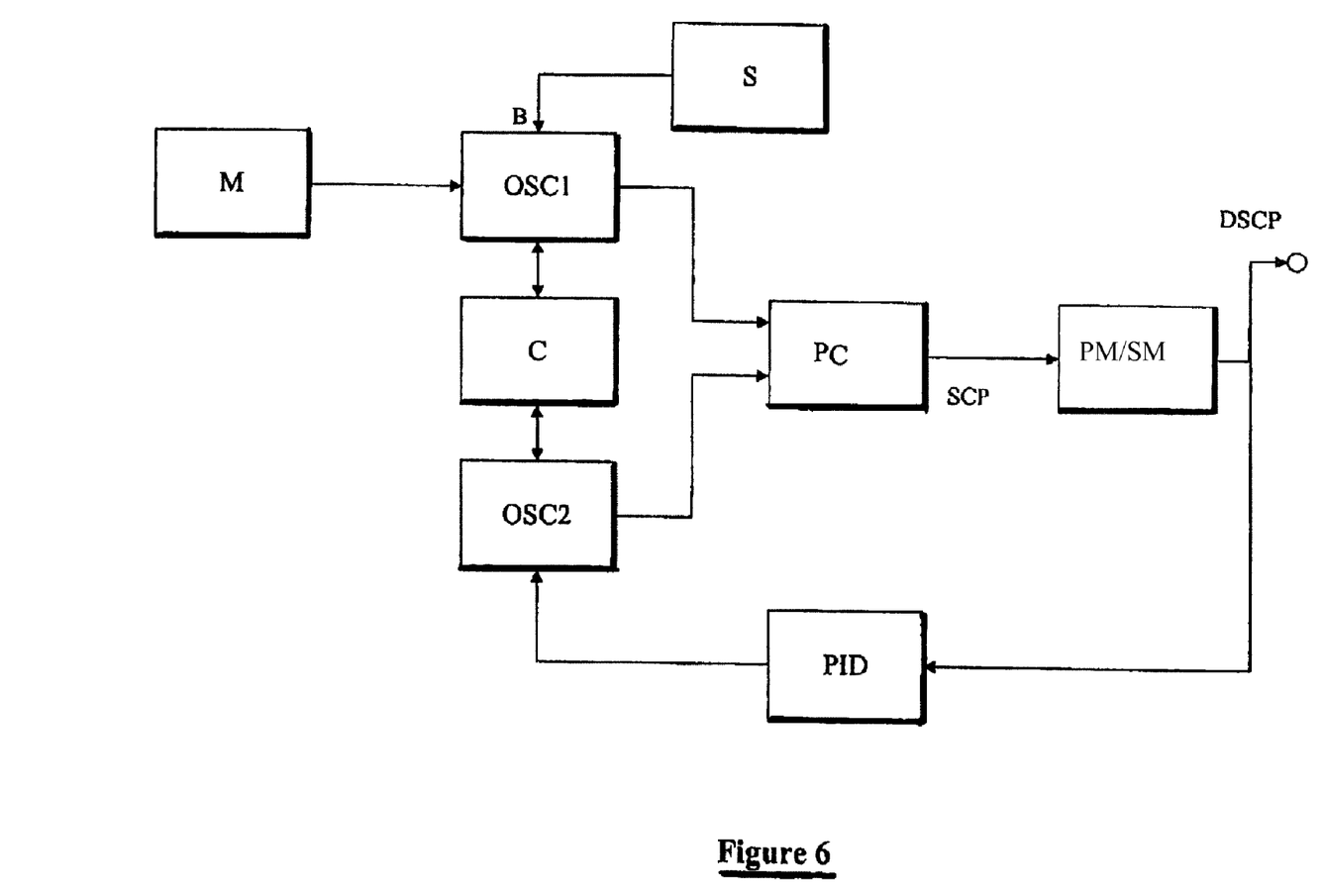
FIG. 6 is a basic diagram of a second device according to the invention.
Figure 7:
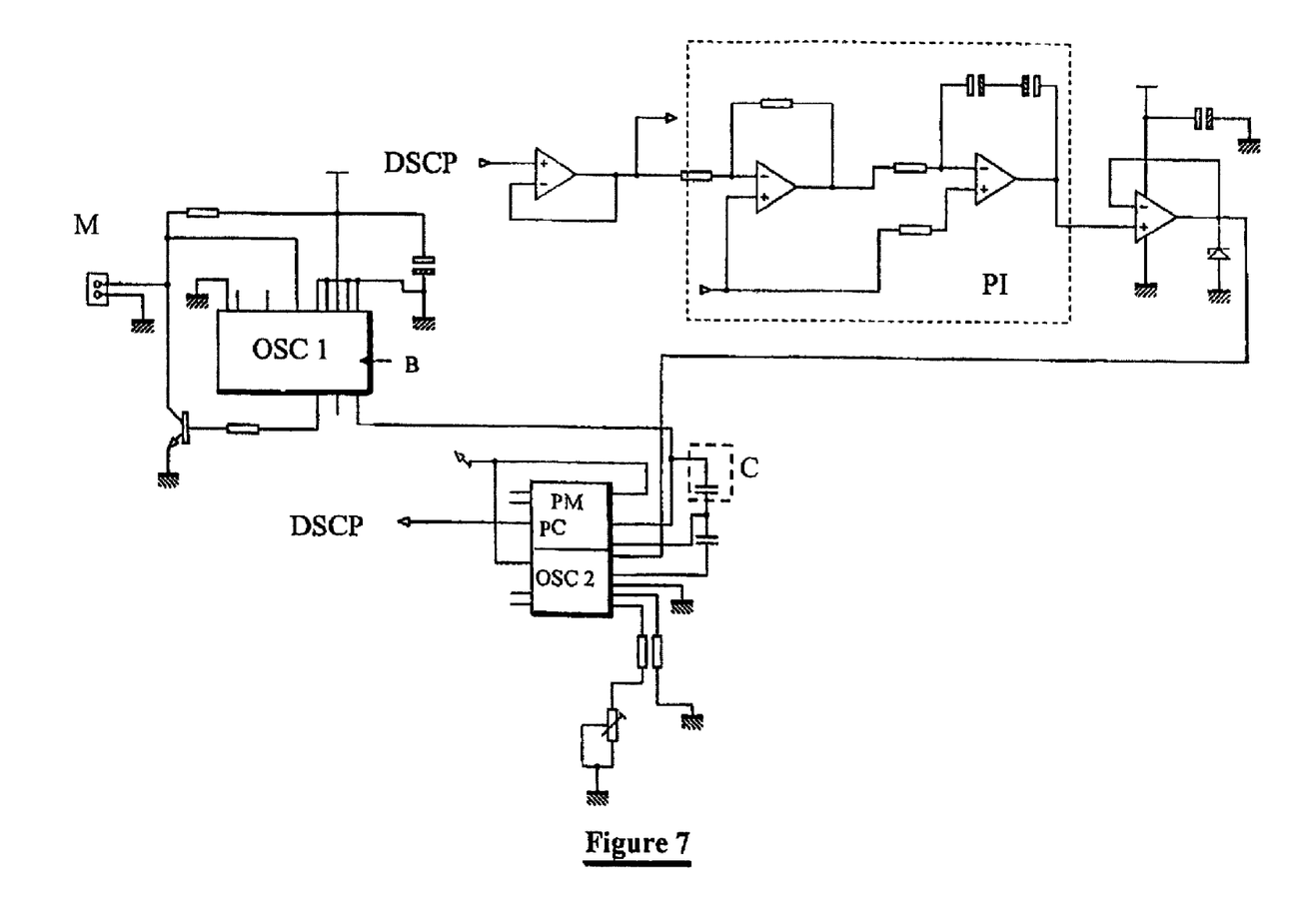
FIG. 7 is an electrical diagram of a second device according to the invention.

According to a second embodiment represented in FIGS. 6 and 7, the device does not use any control logic, and does not comprise any storage component.

Just as for the previous circuit, the measurement sensor M is linked up to the first oscillator OSC1, itself coupled to a second oscillator OSC2 by a capacitor C.

The component having the function of the second oscillator 2 also has the function of the phase comparison PC and peak measurement PM component. The output of the latter, denoted DSCP, is used by a Proportional Integral control component PI to generate in an analog manner a setpoint for the second oscillator OSC2.

Figure 2:
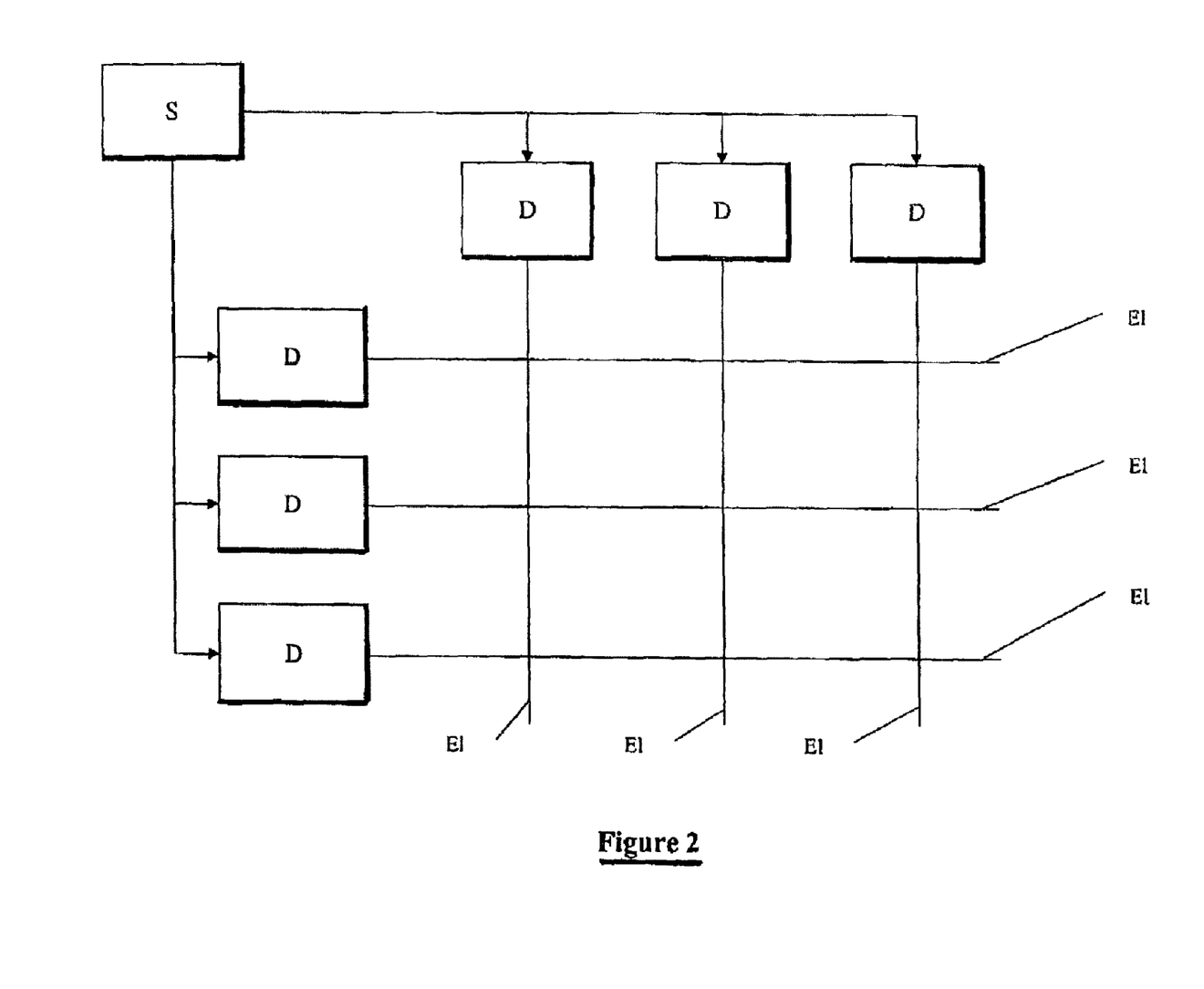
FIG. 2 is a schematic view of a keyboard array according to the invention.

As represented in FIG. 2, several devices D can be assembled into a system, the devices sharing the synchronization means S. This system can in particular be used in a keyboard array as represented in FIG. 2.

A keyboard array comprises rows and columns, the intersections of which mark the location of the keys. Each row and each column comprises an electrode E1, the electrodes of the rows and of the columns forming two layers overlaid a small distance apart. The capacitance between each electrode and the ground is measured. For each device D, the electrode E1 constitutes a part of the measurement sensor M.

The proximity of a finger for example at the level of the location of a key causes:
- a variation in capacitance between a row electrode and ground, and
- a variation in capacitance between a column electrode and ground.

The detection of the variation of these two capacitances makes it possible to identify the proximity of a finger with the key situated at the intersection of the row and column.

Figure 9:
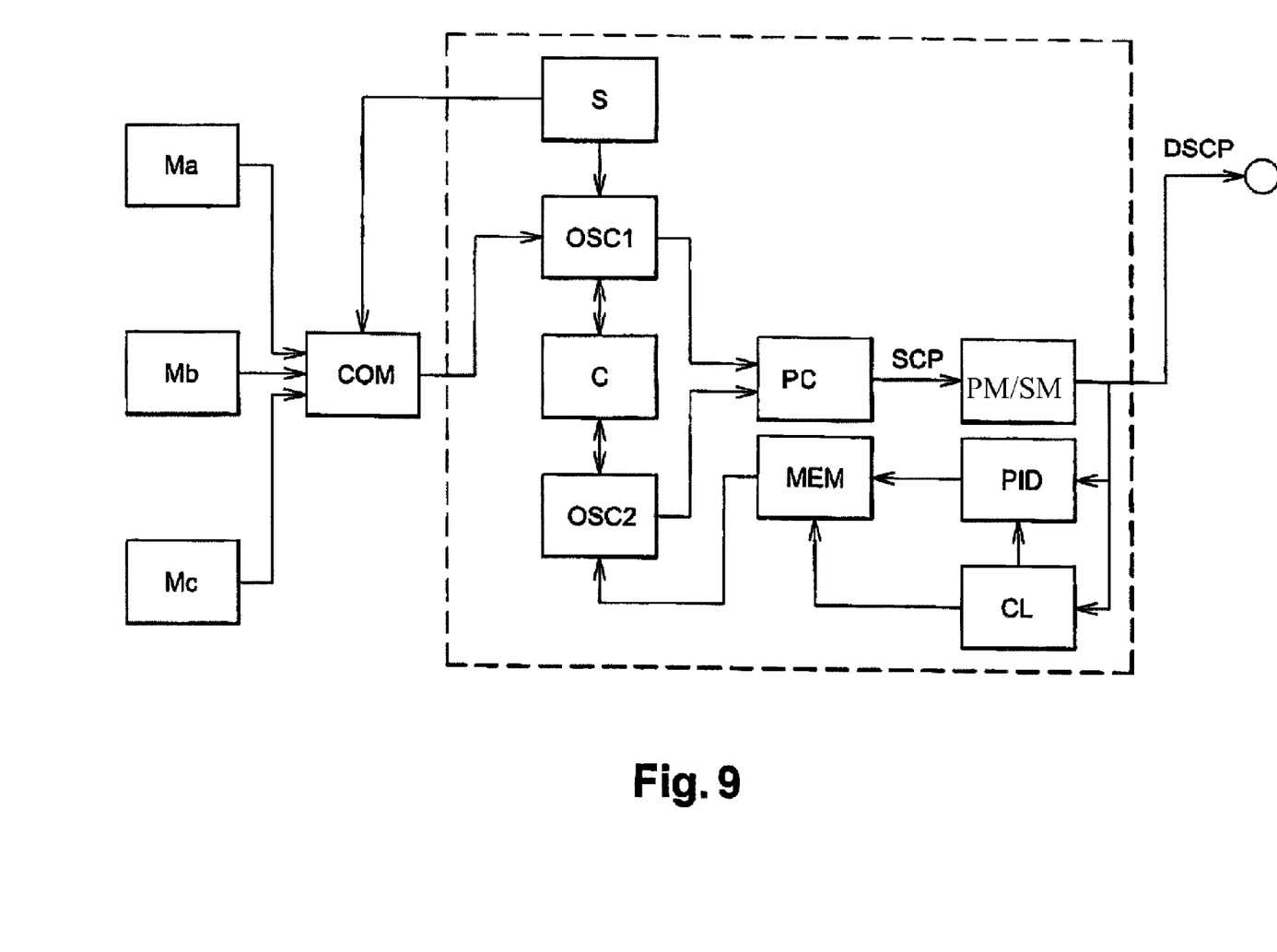
FIG. 9 is a basic diagram of a device according to the invention comprising several sensors linked to one and the same oscillator.

According to a third embodiment represented in FIG. 9, instead of using a system comprising a set of devices according to the first or second embodiment, it is also possible to embody a single device utilizing the signal originating from several sensors Ma, Mb, Mc.

Thus, the device comprises a set of sensors Ma, Mb, Mc linked by a component COM which carries out a switching of the connection between each sensor and a single first oscillator OSC1. The first oscillator is linked downstream to the components such as were described with reference to FIG. 1.

The sensors may for example consist of electrodes, like that used in the keyboard described with reference to FIG. 2.

The switching of the sensors by the switching component COM is controlled by a synchronization component S such as described previously.

These arrangements allow common pooling of most of the components and therefore simplification of the system.

Figure 10:
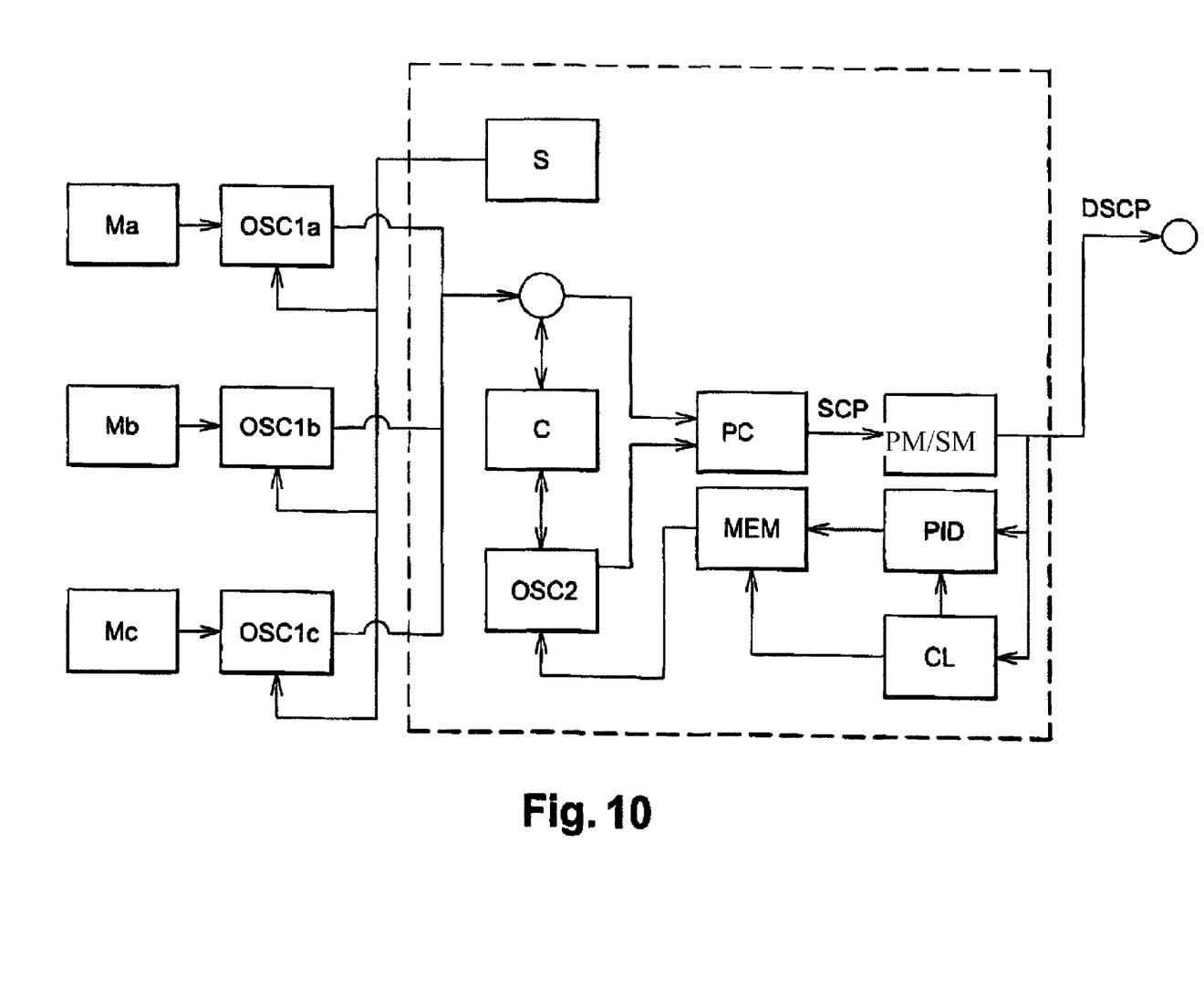
FIG. 10 is a device basic diagram according to the invention comprising several sensors and several first oscillators.

According to a fourth embodiment represented in FIG. 10, the device comprises a first oscillator OSC1a, OSC1b, OSC1c for each sensor Ma, Mb, Mc, each oscillator being blocked or unblocked according to the operating phase.

Downstream of the oscillators OSC1a, OSC1b, OSC1c, the latter are linked to a pooled set of components corresponding to those described with reference to FIG. 1.

These arrangements make it possible to avoid adding additional stray factors between the sensor and the oscillator, which could be caused by the presence of a switching element.

These arrangements make it possible furthermore to site the set consisting of the sensor and of the oscillator some distance away from the remainder of the device, by using between the oscillator and the remainder of the device a remote link. This remote link can be of any type, for example optical, radiofrequency, ultrasound or via a computer network.

These arrangements also make it possible to process heterogeneous signals, for example heterogeneous physical magnitudes with one and the same system. For example, it is possible to envisage processing capacitive, inductive and ultrasound magnitudes in the same device.

In the configuration of the third and fourth embodiments in which several input signals are processed by one and the same device, the synchronization means are designed to carry out successively:
- a selection of a first input signal to be processed, originating from a first sensor Ma during a first processing time period T1, during which the output signal from the first component influences the means of coupling C and of phase comparison PC, then
- a blocking of the influence of any input signal on the phase comparison component during a blocking time period B following the first time period, in such a way that output signal from the phase comparison component returns to a rest position, and then
- a new selection of a second input signal to be processed, originating from a second sensor Mb during a second processing time period T2, during which the output signal from the first component influences the means of coupling C and of phase comparison PC, and then
- a second blocking period is observed.

The alternation of the phases of oscillation T1, T2 and of blocking is looped in such a way that each of the input signals is processed and that a multiplexing of the input signals is obtained.

Figure 12:
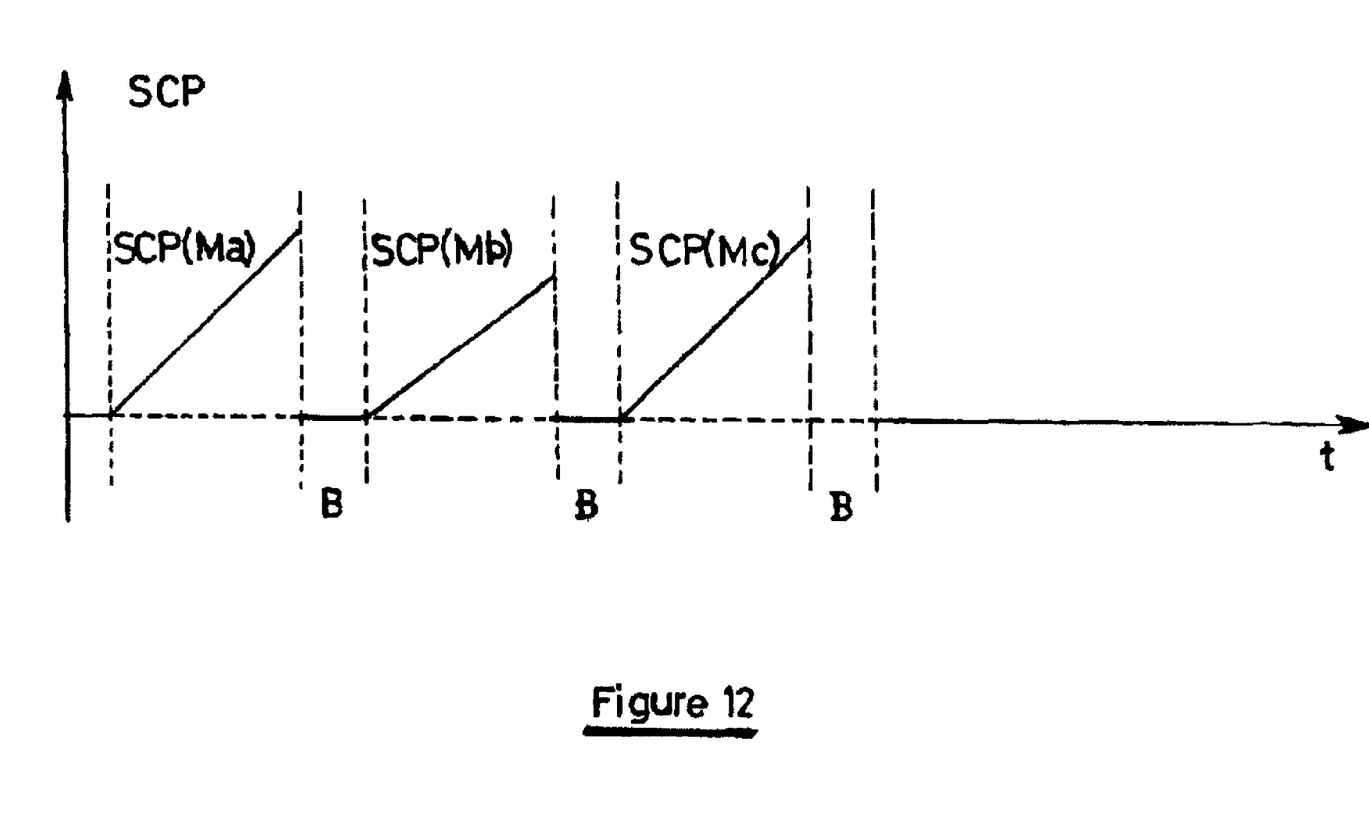
FIG. 12 represents the evolution over time of the output signal from the phase comparison for a device processing several input signals.

An example of the evolution of the output signal SCP from the phase comparison component PC corresponding to the multiplexing described above is represented in FIG. 12.

Figure 8:
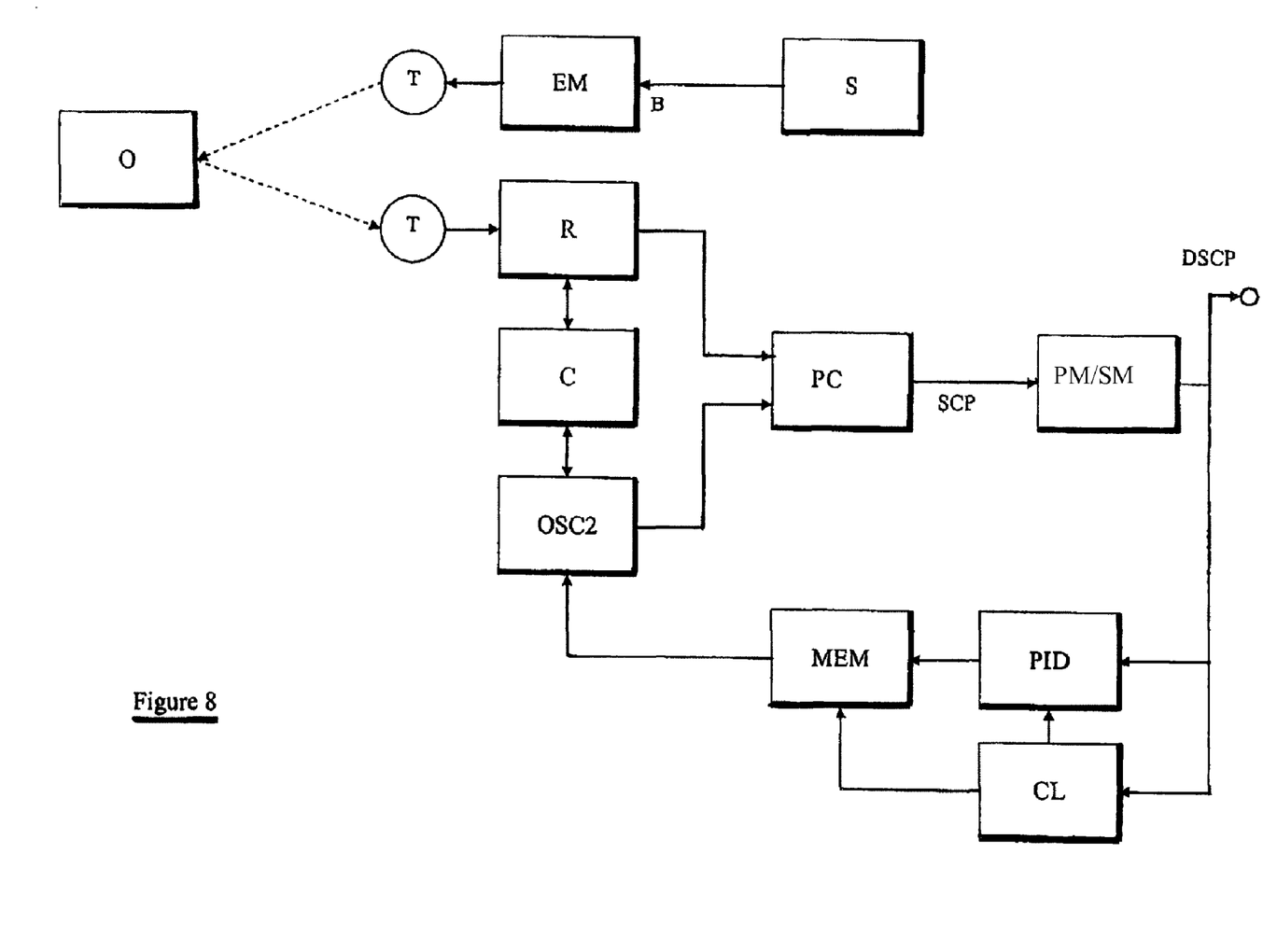
FIG. 8 is a basic diagram of a third device according to the invention.

According to a fifth embodiment, the basic diagram of which is represented in FIG. 8, the device is no longer intended to measure an oscillatory signal originating from an oscillator linked to a sensor, but rather an oscillatory signal originating, or returned by an element external to the device and picked up by a suitable receiver.

This embodiment finds its application for example for determining the speed of a moving object O through the Doppler-Fizeau effect, and for making an in-air motion sensor, using for example an operating frequency between 40 and 200 KHz For this purpose, it is appropriate to use an emitter EM intended to produce a signal emitted at a given frequency, for example 40 KHz, which is produced heading for the object by a Transducer T, then, after reflection on the object, to pick up the signal reflected with another transducer T linked to a receiver R making it possible to carry out an amplification and a shaping of the signal. The signal output by the receiver R is subsequently processed as previously the signal from the first oscillator, the device employing the same elements as in the first embodiment.

Figure 11:
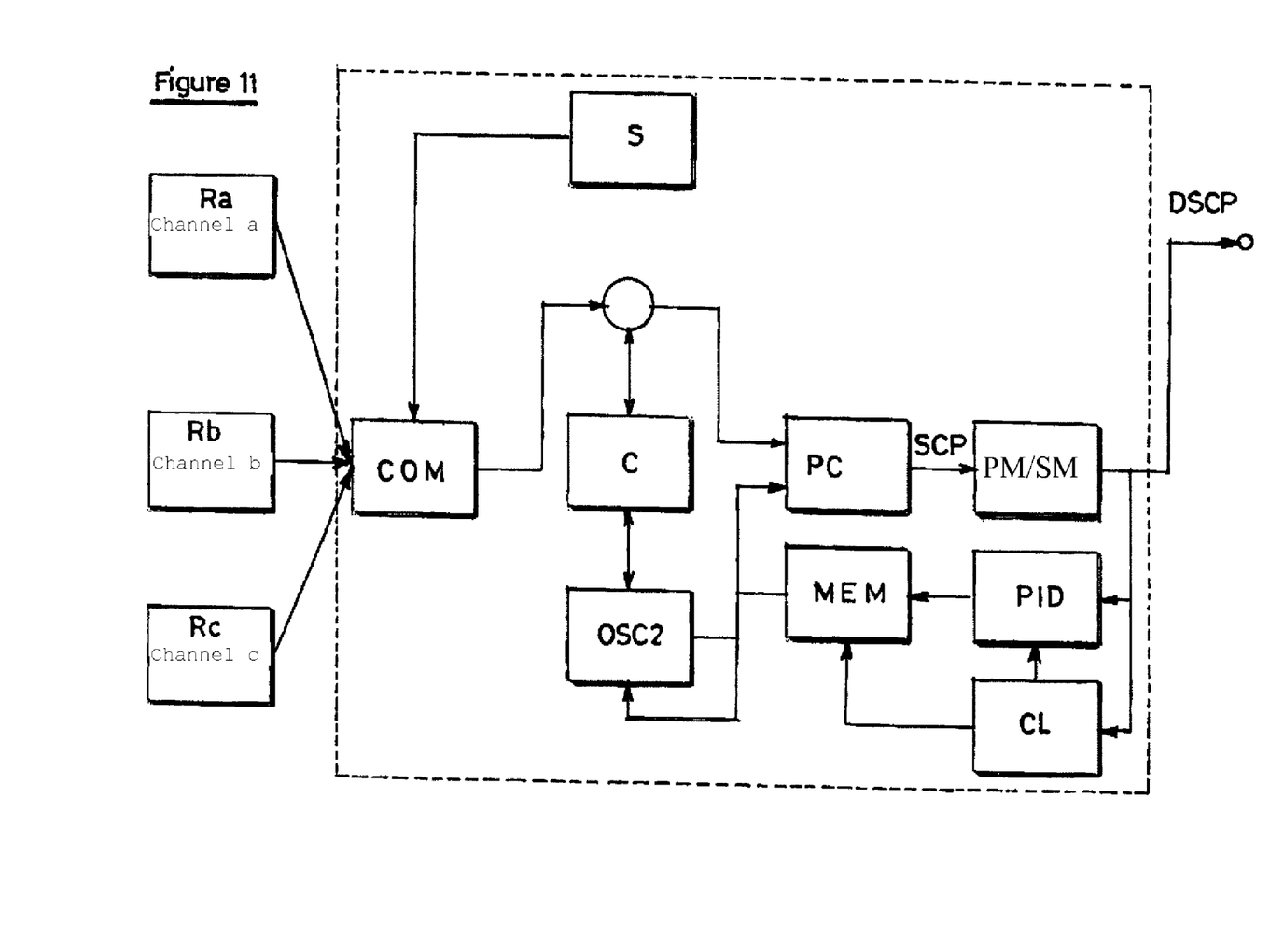
FIG. 11 is a basic diagram of a device according to the invention intended for use as a communication receiver with FM demodulator.

According to a sixth embodiment represented in FIG. 11, the device is used in a communication system with frequency modulation.

In this case, it is not a matter of directly measuring a physical magnitude, but of demodulating signals received on various channels and frequency modulated.

Reception components consisting of reception antennas Ra, Rb, Rc on the various channels receive input signals. These reception components are linked to a switching component, controlled by the synchronization means so as to carry out a selection of the channel on which the signal must be received, and to be able to block the reception of any signal.

The use of the coupling C, of the phase comparator CPF, and of the means MP/PM for determining a derived signal make it possible to carry out a demodulation of the signal for later use of this signal.

The demodulation by the device according to the invention imparts very great sensitivity making it possible to use narrow modulation spans for each communication channel.

Furthermore, it is possible to slave the reception of each channel to a central frequency F0 possibly subject to drifting. Specifically, the drift compensation effect highlighted previously for the measurement of the physical magnitudes is also present in this embodiment.

It should be noted that the physical communication support can be of any type, for example wire, radiofrequency, optical, ultrasound.

It is possible to use several distinct supports as has been described with the physical magnitude sensors. The benefit is to allow a redundancy through various communication pathways.

According to a variant, provision may be made to supplement the circuit with a frequency divider whose division ratio is adjustable, between the first component and the oscillator.

This frequency divider DIV % N makes it possible to choose the operating range of the device.

According to another variant, control components of another type can be used, for example a component carrying out control by fuzzy logic.

The main applications of the device according to the invention are divided into three categories, the list of applications cited below not being exhaustive. The first category relates to tactile machine man interfaces using an operating principle of electrostatic or inductive type. It is possible to cite in particular a keyboard or a capacitive touch screen using a projected capacitive detection, in addition to the keyboard such as described with reference to FIG. 2.

The second category is that of the signal conditioning of a physical magnitude to be measured. This physical magnitude can be of a capacitive, inductive, thermal, ultrasound nature or else a signal used in radiofrequency identification (RFID).

As regards the conditioning of a signal originating from a sensor, the latter is applicable in particular to:
- a capacitive approach sensor detecting a disturbance of the electrostatic field at a distance of less than a meter,
- a proximity sensor of capacitive type detecting a disturbance of the electrostatic field at a distance of a few centimeters or of inductive type detecting eddy currents,
- a metals detector operating by detection of eddy currents,
- a force or pressure sensor of capacitive type using electrodes and insulants stratified or of inductive type using the deformation or the displacement of a test body,
- an accelerometer of capacitive or inductive type using the deformation or the displacement of a test body,
- a chemical sensor of capacitive type using the modification of the dielectric medium,
- a flowmeter for fluids of thermal type using the temperature difference between two components,
- a motion sensor using RF frequencies or ultrasounds and the Doppler/Fizeau effect such as described previously,
- a sensor for monitoring the integrity of a surface or of a wall of capacitive type using the deformation of electrodes and/or a change of the dielectric.

In the case of RFID communication, the device is used as a signal conditioner for an electromagnetic sensor.

The third category relates to the conditioning of signals in the communications sector, in particular illustrated by the embodiment described with reference to FIG. 11.

As goes without saying, the invention is not limited solely to the form of execution of this electronic device, described above by way of example, but on the contrary it embraces all variants.

The invention claimed is:

1. An electronic device, intended to carry out the measurement and the detection of variations of at least one input signal, comprising:
   a first component providing an output signal whose oscillation frequency is representative of the input signal,
   a reference oscillator,
   a phase comparison component carrying out a comparison between the oscillations of the first component and of the reference oscillator, in particular for the purpose of a slaving by a loop of the reference oscillator to the first component, or of the first component to the reference oscillator, or of a mutual slaving, and
   elastic means of coupling between the first component and the reference oscillator,
   wherein the electronic device comprises synchronization means designed to block or permit alternatively influence of the oscillations of the first component on the phase comparison component and on the coupling means, and means for determining a derived signal from an evolution of the output signal from the phase comparison component.

2. The device as claimed in claim 1, wherein the elastic coupling means are designed to carry out an asymmetric coupling in such a way that an influence of the first component on the reference oscillator is greater than an influence of the reference oscillator on the first component.

3. The device as claimed in claim 2, wherein the elastic coupling means are designed to carry out a unidirectional coupling in such a way that the first component influences the reference oscillator.

4. The device as claimed in claim 1, wherein the means for determining a derived signal from the evolution of the output signal from the phase comparison component comprise a component for measuring a slope of the output signal from the phase comparison component.

5. The device as claimed in claim 1, wherein the synchronization means carry out blockings at fixed frequency, and in which the means for determining a derived signal from the evolution of the output signal from the phase comparison component comprise a component for measuring a peak of the signal at an end of an unblocking period.

6. The device as claimed in claim 1, wherein the first component is an oscillator linked to a measurement sensor for measuring a physical magnitude to be measured.

7. The device as claimed in claim 1, wherein the first component is a receiver of a signal external to the device.

8. The device as claimed in claim 7, wherein the receiver is designed to receive a frequency-modulation communication signal.

9. The device as claimed in claim 1, comprising a component for controlling the slaving of the reference oscillator or of the first component.

10. The device as claimed in claim 1, comprising a storage component, making it possible to maintain, according to an operating mode, a constant setpoint voltage for control of the reference oscillator or of the first component for a determined duration.

11. The device as claimed in claim 1, wherein, in an operating mode, the means for determining a derived signal are linked by a loop to the reference oscillator or to the first component so as to apply a correction setpoint with a time constant whose order of magnitude is greater than that of variations of a physical magnitude to be measured and less than that of a drift of a signal representing this physical magnitude.

12. The device as claimed in claim 11, wherein the time constant can be adjusted to a first value in a calibration mode and to a second value, greater than the first, in a compensation mode.

13. The device as claimed in claim 10, wherein, in an operating mode, a looping between an output of the means for determining a derived signal and the reference oscillator or the first component is eliminated, an operating point being maintained by the storage component.

14. The device as claimed in claim 13, wherein, in an operating mode, the looping between the output of the means for determining a derived signal and the reference oscillator or the first component is eliminated if a value of the derived signal or a slope due to the variation of this value is greater than a first determined threshold, the means for determining a derived signal being again linked by a loop to the reference oscillator or to the first component if a value of the derived signal or the slope due to the variation of this value is less than a second determined threshold.

15. The device as claimed in claim 1, intended to carry out the measurement and the detection of variations of at least two input signals, the synchronization means making it possible to selectively process one of the input signals.

16. The device as claimed in claim 15, comprising at least two measurement sensors and switching means allowing controlled by the synchronization means for selectively processing the signal originating from one of the measurement sensors, a single oscillator being situated downstream of the switching means, it being possible for said single oscillator to be blocked by the synchronization means.

17. The device as claimed in claim 15, comprising at least two measurement sensors and an oscillator associated with and downstream of each of the measurement sensors, the synchronization means being designed to select an output of an oscillator to be processed and to block the output of these oscillators.

18. A system comprising at least two devices as claimed in claim 1, wherein common synchronization means make it possible to block alternatively oscillations of the first component in each of the at least two devices of the system.

19. A tactile keyboard array comprising two sets of electrodes for forming rows and columns of a key array and a device as claimed in claim 15, wherein, the input signals originate from the electrodes.

20. The keyboard as claimed in claim 19, wherein the synchronization means block alternatively first components linked to certain electrodes of the keyboard, while allowing operation of other first components linked to other electrodes of the keyboard.

21. The keyboard as claimed in claim 19, wherein the synchronization means control at one and the same time a blocking of a first component, and a grounding of a corresponding electrode.

* * * * *